(12) United States Patent
Abe

(10) Patent No.: US 9,129,819 B2
(45) Date of Patent: Sep. 8, 2015

(54) SEMICONDUCTOR DEVICE AND METHOD OF MANUFACTURING SEMICONDUCTOR DEVICE

(75) Inventor: Hitoshi Abe, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/118,548

(22) PCT Filed: Jun. 14, 2012

(86) PCT No.: PCT/JP2012/065293
§ 371 (c)(1),
(2), (4) Date: Dec. 3, 2013

(87) PCT Pub. No.: WO2013/021727
PCT Pub. Date: Feb. 14, 2013

(65) Prior Publication Data
US 2014/0077329 A1   Mar. 20, 2014

(30) Foreign Application Priority Data

Aug. 5, 2011   (JP) .................................. 2011-171521

(51) Int. Cl.
| H01L 29/66 | (2006.01) |
| H01L 29/06 | (2006.01) |
| H01L 29/40 | (2006.01) |
| H01L 29/739 | (2006.01) |

(Continued)

(52) U.S. Cl.
CPC ........ *H01L 29/0611* (2013.01); *H01L 29/0619* (2013.01); *H01L 29/0692* (2013.01); *H01L 29/0696* (2013.01); *H01L 29/404* (2013.01); *H01L 29/7395* (2013.01); *H01L 29/7811* (2013.01); *H01L 29/8611* (2013.01)

(58) Field of Classification Search
CPC ........................................................ H01L 29/00
USPC ........................................... 257/E29.013, 484
See application file for complete search history.

(56) References Cited

U.S. PATENT DOCUMENTS

| 4,399,449 A | * | 8/1983 | Herman et al. ................ 257/490 |
| 4,412,242 A | * | 10/1983 | Herman et al. ................ 257/634 |
| 4,573,066 A | * | 2/1986 | Whight ......................... 257/495 |

(Continued)

FOREIGN PATENT DOCUMENTS

| JP | H01-225164 A | 9/1989 |
| JP | H07-115192 A | 5/1995 |

(Continued)

*Primary Examiner* — Telly Green
(74) *Attorney, Agent, or Firm* — Rabin & Berdo, P.C.

(57) ABSTRACT

A breakdown voltage structure portion includes a field plate with an annular polysilicon field plate and a metal field plate. In the breakdown voltage structure portion, a plurality of annular guard rings are provided in a surface layer of the semiconductor substrate. The polysilicon field plates are separately arranged on the inner circumferential side and the outer circumferential side of the guard ring. Polysilicon bridges that connect the polysilicon field plates on the inner and outer circumferential sides are provided on at least one guard ring among the plurality of guard rings at a predetermined interval so as to be arranged over the entire circumference of the guard ring. The metal field plate is provided on the guard ring in a corner portion of the breakdown voltage structure portion and at least one guard ring in a straight portion of the breakdown voltage structure portion.

16 Claims, 7 Drawing Sheets

(51) Int. Cl.
*H01L 29/78* (2006.01)
*H01L 29/861* (2006.01)

(56) References Cited

U.S. PATENT DOCUMENTS

| | | | | |
|---|---|---|---|---|
| 4,593,302 | A | * | 6/1986 | Lidow et al. ............ 257/342 |
| 4,602,266 | A | * | 7/1986 | Coe .................. 257/495 |
| 4,914,047 | A | | 4/1990 | Seki |
| 4,974,059 | A | * | 11/1990 | Kinzer ................ 257/342 |
| 5,028,548 | A | * | 7/1991 | Nguyen ............... 438/488 |
| 5,385,852 | A | | 1/1995 | Oppermann et al. |
| 5,474,946 | A | | 12/1995 | Ajit et al. |
| 5,723,890 | A | * | 3/1998 | Fujihira et al. ........ 257/339 |
| 5,777,373 | A | * | 7/1998 | Groenig ............... 257/495 |
| 7,126,192 | B2 | * | 10/2006 | Brech ................. 257/341 |
| 7,989,878 | B2 | * | 8/2011 | Rahimo ............... 257/328 |
| 2004/0129963 | A1 | | 7/2004 | Amo et al. |
| 2008/0169526 | A1 | | 7/2008 | Wakimoto et al. |
| 2009/0194786 | A1 | | 8/2009 | Iwamoto et al. |
| 2011/0059467 | A1 | * | 3/2011 | Ting et al. ............ 435/7.21 |

FOREIGN PATENT DOCUMENTS

| | | | | | |
|---|---|---|---|---|---|
| JP | H08-250512 | A | | 9/1996 | |
| JP | 2003-031791 | A | | 1/2003 | |
| JP | 2003031791 | A | * | 1/2003 | ........ H01L 29/06 |
| JP | 2004-214512 | A | | 7/2004 | |
| JP | 3591301 | B2 | | 11/2004 | |
| JP | 2008-193043 | A | | 8/2008 | |
| JP | 2009-117715 | | | 5/2009 | |

* cited by examiner

SEMICONDUCTOR DEVICE AND METHOD OF MANUFACTURING SEMICONDUCTOR DEVICE

BACKGROUND

1. Technical Field

The present invention relates to a high-breakdown-voltage power semiconductor device that is used in, for example, a power conversion apparatus and a method of manufacturing a semiconductor device.

2. Background Discussion

In the related art, a power semiconductor device has been known which includes an element active portion to which a main current flows and a region that reduces the electric field around the element active portion to hold a breakdown voltage (for example, see the following Patent Literature 2 (FIG. 1 and FIG. 5-1)). Next, the power semiconductor device disclosed in the following Patent Literature 2 will be described. FIG. 6 is a diagram illustrating the structure of a semiconductor device according to the related art. FIG. 6(a) is a plan view illustrating the semiconductor device according to the related art disclosed in the following Patent Literature 2. The semiconductor device according to the related art illustrated in FIG. 6 includes an element active portion 2 which is provided at the center of a semiconductor substrate 1 and to which a main current flows and a breakdown voltage structure portion 3 that is provided around the element active portion 2 and surrounds the element active portion 2.

In FIG. 6(a), a straight portion of the breakdown voltage structure portion 3 is represented by reference numeral 3-1 and a corner portion that connects the straight portions 3-1 in a curved shape is represented by reference numeral 3-2. A detailed planar pattern indicating the actual structure formed in each of the element active portion 2 and the breakdown voltage structure portion 3 is not illustrated in FIG. 6(a). FIG. 6(b) is a cross-sectional view illustrating the breakdown voltage structure portion 3 taken along the line A-A of FIG. 6(a). FIG. 6(c) is an enlarged cross-sectional view illustrating a part of the breakdown voltage structure portion 3 which is surrounded by a rectangular frame (hereinafter, referred to as a dashed line frame) represented by a dashed line in FIG. 6(b).

In the breakdown voltage structure portion 3 of the semiconductor device according to the related art illustrated in FIG. 6, in an off state, the front surface of the n-type semiconductor substrate 1 is covered with at least an insulating film 5 in order to hold an off voltage applied between an upper electrode and a lower electrode (the upper electrode is a metal electrode 9a and the lower electrode is not illustrated) of the n-type semiconductor substrate 1 with high reliability. The insulating film 5 is generally an oxide film. For example, a silicon nitride (SiN)-based insulating film may be formed as the insulating film 5. In addition, in many cases, the breakdown voltage structure portion 3 is not only covered with the insulating film 5, but is also provided with an electric field reduction structure, such as a guard ring 4b or field plates 7 and 9b, in order to improve the breakdown voltage. Reference numeral 11 indicates an oxide film.

The field plate 9b has a function of improving the breakdown voltage using the electric field reduction function described above and a function of shielding (blocking) external charge which gets into the vicinity of the front surface of the insulating film 5 in the breakdown voltage structure portion 3 from an external environment to maintain long-term breakdown voltage reliability (also referred to as charge resistance or an induced charge shielding function). In some cases, when external charge (not illustrated) reaches the surface of the insulating film 5 and is then attached thereto, the polarity of the charge induced in the insulating film 5 affects an electric field intensity distribution in the vicinity of the front surface of the n-type semiconductor substrate 1 immediately below the insulating film 5 at the time when an off voltage is applied and breakdown voltage reliability deteriorates, which is not preferable.

In addition, the field plate 9b is formed at the same time as the metal electrode 9a which contacts the surface of a p-type well region 4a on the front surface of the element active portion 2 is formed, in order to improve the efficiency of a manufacturing process. Therefore, in general, the field plate 9b and the metal electrode 9a are formed using the same kind of metal film. For the above-described charge resistance, the thick field plate 9b, which is a metal film, has the feature that the performance of interrupting the effect of the external charge is higher than that of the thin field plate 7, which is a polysilicon film. As the metal film including the metal electrode 9a and the field plate 9b, for example, an aluminum alloy (Al—Si alloy) film having a very small amount of silicon (Si) added thereto is formed on the front surface of the n-type semiconductor substrate 1 by a sputtering method.

In particular, in the power semiconductor device, the metal film including the metal electrode 9a and the field plate (hereinafter, referred to as a metal field plate) 9b is formed with a relatively large thickness of about 3 μm to 5 μm. Therefore, the metal electrode 9a and the metal field plate 9b are processed into a desired electrode pattern or a desired field plate pattern by wet etching using a photo process, not dry etching. However, since the metal film, such as a relatively thick Al—Si alloy film, is patterned by wet etching, a variation in the amount of etching, such as a variation in the side etching width of the metal film, is likely to increase. As a result, there is a concern that a variation in the initial breakdown voltage will increase.

In order to reduce the variation in the breakdown voltage, it is necessary to predict the magnitude of the variation in the amount of etching, such as the variation in the side etching width, and design the breakdown voltage structure portion 3 such that the width of the breakdown voltage structure portion 3 (the width of the breakdown voltage structure portion 3 in a direction from the boundary with the element active portion 2 to the end of the n-type semiconductor substrate 1) is large. However, when the width of the breakdown voltage structure portion 3 increases, the chip size increases, which is not preferable in terms of a reduction in costs.

For example, a conductive polysilicon film or a semi-insulating thin film is used as the field plate 7. The field plate 7 is thinner than the relatively thick metal field plate 9b and can be patterned by dry etching. Therefore, the patterning accuracy of the field plate 7 is higher than that of the metal field plate 9b.

As the electric field reduction effect of the breakdown voltage structure portion 3 is enhanced in order to increase the breakdown voltage, the width of the breakdown voltage structure portion 3 needs to increase. However, in this case, as described above, the width of the breakdown voltage structure portion 3 increases, which results in an increase in the chip size. In addition, when the width of the breakdown voltage structure portion 3 increases, the area of the breakdown voltage structure portion 3 occupied in the semiconductor device increases and the area of the element active portion 2 is relatively reduced. Therefore, it is preferable that the width of the breakdown voltage structure portion 3 be small.

In the breakdown voltage structure portion 3 according to the related art illustrated in FIG. 6, the field plate has a double structure of the metal film and the polysilicon film in order to improve the patterning accuracy of the metal field plate 9b. The field plate with the double structure includes the field plate (hereinafter, referred to as a polysilicon field plate) 7, which is a polysilicon film, as a lower layer, and the metal field plate 9b as an upper layer.

The width of the polysilicon field plate 7, which is the lower layer, is substantially equal to the width of the metal field plate 9b, which is the upper layer. In this way, it is possible to improve both the electric field reduction effect and charge resistance while minimizing an increase in the width of the breakdown voltage structure portion 3. In addition, since the polysilicon film is used as the lower layer of the field plate with the double structure, it is possible to reduce a variation in the initial breakdown voltage, as compared to a case in which the field plate includes only the metal field plate 9b.

When the field plate with the double structure described above is formed, each field plate and each guard ring need to have the same potential in order to validate the electric field reduction function. In order to achieve the structure, an opening portion is provided in the insulating film on the surface of the guard ring and the field plate contacts the guard ring through the opening portion. In this case, in order to consider both the patterning accuracy of the insulating film by etching and alignment accuracy and form a low-resistance contact portion, it is necessary to increase the width of the guard ring, as compared to a case in which the contact portion is not provided.

In order to meet the requirements, the following Patent Literature 2 discloses a structure in which a contact portion provided in an insulating film 5 is arranged only on a p-type guard ring 4b in four corner portions 3-2 of a breakdown voltage structure portion 3 and is not arranged in a straight portion 3-1 of the breakdown voltage structure portion 3 such that the width of the guard ring does not increase. As a result, in the following Patent Literature 2, the width of the breakdown voltage structure portion 3 is not actually changed and a semiconductor device with a small variation in initial breakdown voltage is obtained.

As another factor which affects the variation in the initial breakdown voltage, there is misalignment between the guard ring and the field plate. In general, a p-type layer of the guard ring is formed by forming an opening portion in an oxide film using a photolithography method and implanting p-type impurity ions (for example, boron (B) ions) into an n-type semiconductor substrate using the oxide film as a mask. In the field plate, a mask different from the mask which is used to form the guard ring is used to pattern the metal field plate or the polysilicon field plate.

As such, since different masks are used to form the guard ring and the field plate, it is inevitable that misalignment occurs between the pattern of the guard ring and the pattern of the field plate in the photolithography process (particularly, exposure) using each mask. The misalignment (alignment accuracy) is the relative positional deviation between the guard ring and the field plate and causes a variation in an electric field intensity distribution. As a result, a variation in breakdown voltage occurs.

As a method of reducing the variation in breakdown voltage caused by the misalignment, a method has been proposed which forms a self-aligned guard ring using a polysilicon field plate as a mask, without using an oxide film patterned by photolithography as the mask, to omit an alignment process, thereby reducing the variation in breakdown voltage (for example, see the following Patent Literature 3 (FIG. 3 and paragraphs [0007] and [0009])). In the following Patent Literature 3, since alignment for forming the guard ring is not performed, the number of alignment processes is reduced by one and misalignment is reduced.

For the field plate technique of the breakdown voltage structure portion, in order to obtain stable high breakdown voltage characteristics without increasing the area of the breakdown voltage structure portion occupied in the semiconductor device, a technique has been proposed in which a field plate, which is a conductive film, and a field plate, which is a semi-insulating film, are alternately arranged on a plurality of annular guard rings (for example, see the following Patent Literature 1 (FIG. 1 and paragraph [0026])).

CITATION LIST

Patent Literature

Patent Literature 1: Japanese Patent No. 3591301
Patent Literature 2: JP 2008-193043 A
Patent Literature 3: JP 8-250512 A

SUMMARY

Technical Problem

However, in the above-mentioned Patent Literature 2, alignment accuracy is reduced due to a plurality of alignment processes for forming the contact portion between the field plate and the surface of the guard ring only in the four corner portions of the breakdown voltage structure portion. Therefore, the problem of a variation in the initial breakdown voltage occurring due to the reduction in alignment accuracy is not solved. For example, the electric field reduction effect obtained by the field plates 7 and 9b in the breakdown voltage structure portion 3 illustrated in FIG. 6(c) varies depending on the protruding distance (the distance from the end of the guard ring 4b in the left-right direction) of the field plates 7 and 9b from the end of the guard ring 4b.

In the case of the field plate with the double structure, particularly, the protruding distance of the polysilicon field plate 7 close to the front surface of the n-type semiconductor substrate 1 is important. The protruding distance X of the polysilicon field plate 7 is a distance from the position of the side wall of the opening portion in the insulating film 5, which is a field oxide film, to the position of the end of the polysilicon field plate 7 extending onto the insulating film 5. The position of the side wall of the opening portion in the insulating film 5 and the position of the end of the polysilicon field plate 7 are changed by the influence of alignment accuracy when the opening portion of the insulating film 5 and the polysilicon field plate 7 are formed.

When alignment accuracy is represented by the magnitude of misalignment, the positional deviation of the size wall of the opening portion in the insulating film 5 is ±a, and the positional deviation of the end of the polysilicon field plate 7 is ±b, a variation in the protruding distance X of the polysilicon field plate 7 is X±(a+b). The capability of reducing the electric field varies depending on the variation X±(a+b) in the protruding distance X of the polysilicon field plate 7. As a result, a variation in the initial breakdown voltage occurs due to a variation in the capability of reducing the electric field. For example, in the field of in-vehicle power semiconductor devices, an initial breakdown voltage variation less than normal is required. Therefore, the breakdown voltage variation is important. Apparatuses with a large breakdown voltage variation may be sorted. However, in this case, costs increase.

In the above-mentioned Patent Literature 3, when ion implantation is performed for the opening portion of the polysilicon field plate to form the self-aligned guard ring, it is difficult to easily form the contact (conductive contact) portion between the surface of the guard ring and the polysilicon field plate. In addition, even when the metal field plate made of, for example, aluminum (Al) is formed above the polysilicon field plate with the interlayer insulating film interposed therebetween, it is difficult remove the interlayer insulating film buried in the contact portion. Therefore, it is difficult to bring the field plate into contact with the surface of the guard ring.

In the breakdown voltage structure portion 3 disclosed in the above-mentioned Patent Literature 2, the polysilicon field plate 7 and the guard ring 4b are electrically connected to the metal field plate 9b only at one or two points of the four corner portions 3-2 of the breakdown voltage structure portion 3 and have the same potential. In addition, even when the sheet resistance of the polysilicon field plate 7 is sufficiently reduced to several tens of ohms per square, it is higher than that of the metal field plate 9b. Therefore, for example, when a chip size increases in order to increase the current flowing to the element and the length of the straight portion 3-1 of the breakdown voltage structure portion 3 increases in order to respond to the increase in the chip size, the applied external charge has a large adverse effect on the breakdown voltage structure portion 3.

Specifically, on the same guard ring 4b, a potential difference occurs between the contact portion in the corner portion 3-2 of the breakdown voltage structure portion 3 and the guard ring 4b in the straight portion 3-1 of the breakdown voltage structure portion 3 or the vicinity of the middle of the polysilicon field plate 7 arranged on the guard ring 4b due to the applied external charge. As a result, there is a concern that the balance of the electric field intensity distribution will be broken and the breakdown voltage will be reduced. In other words, among the peak values of electric field intensity at the outer circumferential end of the p-type well region 4a in the element active portion 2 and the ends of a plurality of guard rings 4b in the breakdown voltage structure portion 3, only the electric field intensity of a given guard ring 4b is abnormally increased due to the occurrence of the potential difference caused by the applied external charge. Therefore, local avalanche breakdown occurs only at one point even at a low operating voltage and a breakdown current is concentrated. As a result, there is a concern that the breakdown voltage will be reduced. In other words, there is a problem in that the distribution of the breakdown voltage is unbalanced due to the local avalanche breakdown.

For example, even when a strong external charge is applied to the breakdown voltage structure portion 3, the effect of fixing the external charge to the same potential as that of the field plate can be obtained to some extent by the field plate with the double structure. However, as described above, the field plate with the double structure is electrically connected to the guard ring only at one or two points of the contact portions provided in four corner portions 3-2 of the breakdown voltage structure portion 3. In addition, the sheet resistance of the polysilicon field plate 7 and the guard ring 4b is more than that of the metal field plate 9b.

Therefore, on the same guard ring 4b, potential is not sufficiently fixed between the contact portion in four corner portions 3-2 of the breakdown voltage structure portion 3 and the guard ring 4b in the straight portion 3-1 of the breakdown voltage structure portion 3 or particularly the vicinity of the middle of the polysilicon field plate 7 arranged on the guard ring 4b. As a result, a potential difference occurs between the two points and the balance of the electric field intensity distribution is likely to be broken. It is preferable to prevent the occurrence of the potential difference due to resistance components such as the polysilicon field plate 7 and the guard ring 4b.

SUMMARY

In order to solve the aforementioned problems of the related art, an object of the invention is to provide a semiconductor device and a method of manufacturing the semiconductor device which can reduce a variation in an initial breakdown voltage, is less likely to be adversely affected by external charge, and have high long-term breakdown voltage reliability.

In order to solve the aforementioned problems and achieve the object of the invention, the semiconductor device according to the invention has the following characteristics. An element active portion to which a main current flows is provided in a rectangular first-conduction-type semiconductor substrate. A breakdown voltage structure portion that includes straight portions and corner portions connecting the straight portions in a curved shape and surrounds the element active portion is provided. Second-conduction-type guard rings that extend from the straight portion to the corner portion of the breakdown voltage structure portion are provided in a surface layer of the first-conduction-type semiconductor substrate. Annular polysilicon field plates are provided above a surface of the guard ring with an insulating film interposed therebetween. The annular polysilicon field plates are separately arranged on an inner circumferential side and an outer circumferential side of the guard ring. A plurality of polysilicon bridges that connect the polysilicon field plates at a predetermined interval are provided on the insulating film between the polysilicon field plate on the inner circumferential side and the polysilicon field plate on the outer circumferential side. An interlayer insulating film is provided on the surfaces of the insulating film, the polysilicon field plate, the polysilicon bridge, and the guard ring. A contact hole is provided in the interlayer insulating film such that the polysilicon bridge and the guard ring are selectively exposed. A metal field plate that comes into contact with the polysilicon bridge and the guard ring through the contact hole and electrically connects the polysilicon bridge and the surface of the guard ring is provided. The metal field plate is provided on the guard ring in the corner portion of the breakdown voltage structure portion and at least one of the guard rings in the straight portion of the breakdown voltage structure portion.

In the semiconductor device according to the invention, the guard ring may be arranged in an annular shape, and the metal field plate may be provided in the entire circumference of at least one of the guard rings.

In the semiconductor device according to the invention, the width of the polysilicon bridge may be less than two times the diffusion depth of the guard ring.

In the semiconductor device according to the invention, the width of the polysilicon bridge may be less than 0.8 times the diffusion depth of the guard ring.

In the semiconductor device according to the invention, the guard ring that has the metal field plate on a portion arranged in the corner portion and the straight portion of the breakdown voltage structure portion and the guard ring that has the metal field plate only on a portion arranged in the corner portion may be alternately arranged in a direction from the element active portion to an outer circumferential portion of the first-conduction-type semiconductor substrate.

In order to solve the problems and achieve the object of the invention, there is provided a method of manufacturing a semiconductor device including an element active portion which is provided in a rectangular first-conduction-type semiconductor substrate and to which a main current flows, a breakdown voltage structure portion that includes straight portions and corner portions connecting the straight portions in a curved shape and surrounds the element active portion, second-conduction-type guard rings that are provided in a surface layer of the first-conduction-type semiconductor substrate so as to extend from the straight portion to the corner portion of the breakdown voltage structure portion, annular polysilicon field plates that are provided above a surface of the guard ring with an insulating film interposed therebetween and are separately arranged on an inner circumferential side and an outer circumferential side of the guard ring, a plurality of polysilicon bridges that are provided on the insulating film between the polysilicon field plate on the inner circumferential side and the polysilicon field plate on the outer circumferential side and connect the polysilicon field plates at a predetermined interval, an interlayer insulating film that is provided on the surfaces of the insulating film, the polysilicon field plate, the polysilicon bridge, and the guard ring, a contact hole that is provided in the interlayer insulating film such that the polysilicon bridge and the guard ring are selectively exposed, and a metal field plate that comes into contact with the polysilicon bridge and the guard ring through the contact hole and electrically connects the polysilicon bridge and the surface of the guard ring, the metal field plate being provided on the guard ring in the corner portion of the breakdown voltage structure portion and at least one of the guard rings in the straight portion of the breakdown voltage structure portion. The method has the following characteristics. First, a plurality of the annular polysilicon field plates that surround the element active portion are formed on a surface of the first-conduction-type semiconductor substrate. Then, implanting second-conduction-type impurities are implanted into a portion of the first-conduction-type semiconductor substrate which is exposed between the polysilicon field plates using the polysilicon field plates as a mask to form the guard ring.

According to the invention, since ion implantation for forming the self-aligned guard ring is performed using the polysilicon field plate as a mask, an alignment process for forming the guard ring may not be performed. Therefore, a variation in the protruding distance of the polysilicon field plate can be only a variation in etching when the polysilicon field plate is patterned. In this way, it is possible to reduce misalignment and prevent the relative positional deviation between the guard ring and the field plate.

According to the invention, the potential of the polysilicon field plate and the guard ring is sufficiently fixed through the metal field plate and the polysilicon bridge and the polysilicon field plate and then the guard ring have the same potential. In this way, on the same guard ring, the potential between the contact portion in the corner portion of the breakdown voltage structure portion and the guard ring in the straight portion of the breakdown voltage structure portion or the vicinity of the middle of the polysilicon field plate which is provided on the guard ring is fixed and there is a little potential difference therebetween. Therefore, it is possible to obtain the capability of stably reducing the electric field.

According to the invention, the potential of the polysilicon field plate and the guard ring is sufficiently fixed and the polysilicon field plate and the guard ring have the same potential. Therefore, even when external charge is applied onto the breakdown voltage structure portion, it is possible to prevent the occurrence of the potential difference between the contact portion in the corner portion of the breakdown voltage structure portion and the guard ring in the straight portion of the breakdown voltage structure portion or the vicinity of the middle of the polysilicon field plate which is provided on the guard ring, on the same guard ring. In this way, it is possible to prevent the occurrence of local avalanche breakdown and thus prevent a reduction in the breakdown voltage.

Advantageous Effects of Invention

According to the semiconductor device and the method of manufacturing the semiconductor device of the invention, it is possible to reduce a variation in initial breakdown voltage. In addition, according to the semiconductor device and the method of manufacturing the semiconductor device of the invention, it is possible to provide a semiconductor device which is less likely to be adversely affected by external charge and has high long-term breakdown voltage reliability.

DETAILED DESCRIPTION

Figure 1:
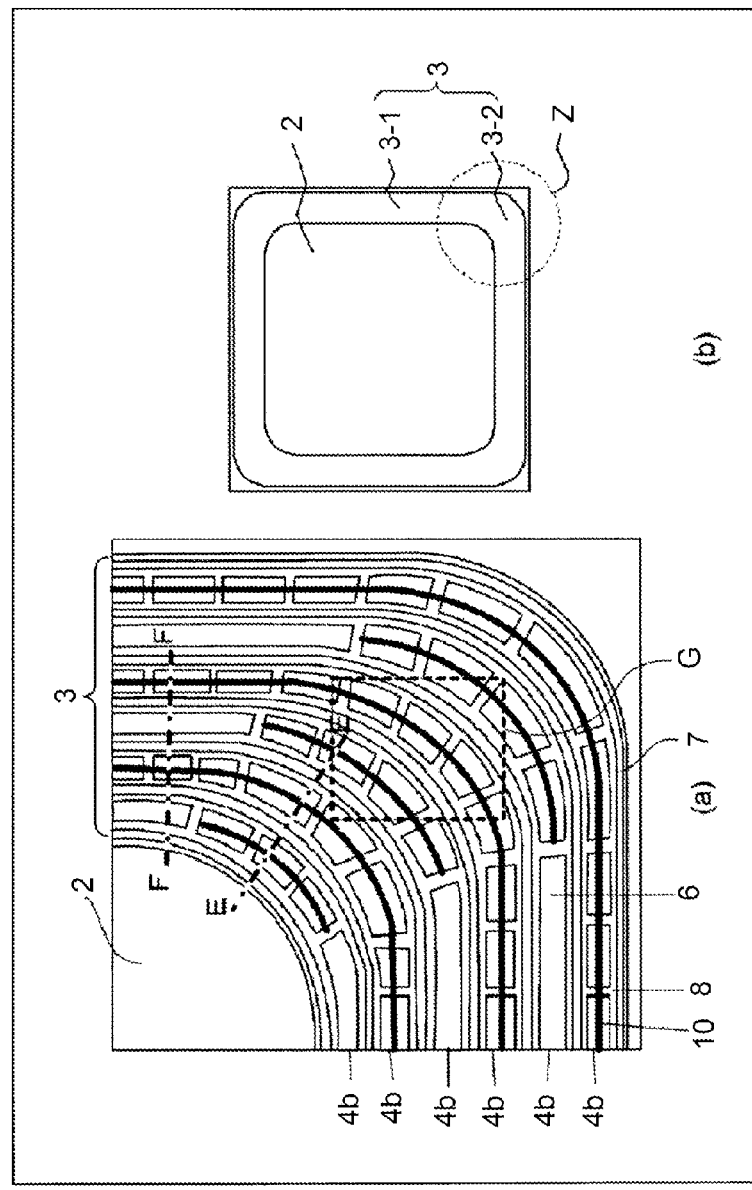
FIG. 1 is a plan view illustrating the structure of a semiconductor device according to an embodiment of the invention.

Hereinafter, a semiconductor device and a method of manufacturing a semiconductor device according to an exemplary embodiment of the invention will be described in detail with reference to the accompanying drawings. The invention is not limited to the following embodiment. In the following description, a first conduction type is an n type and a second conduction type is a p type. However, the n type and the p type may be reversed. In the following description of the embodiment and the accompanying drawings, the same components are denoted by the same reference numerals and the description thereof will not be repeated.

Embodiment

Figure 2:
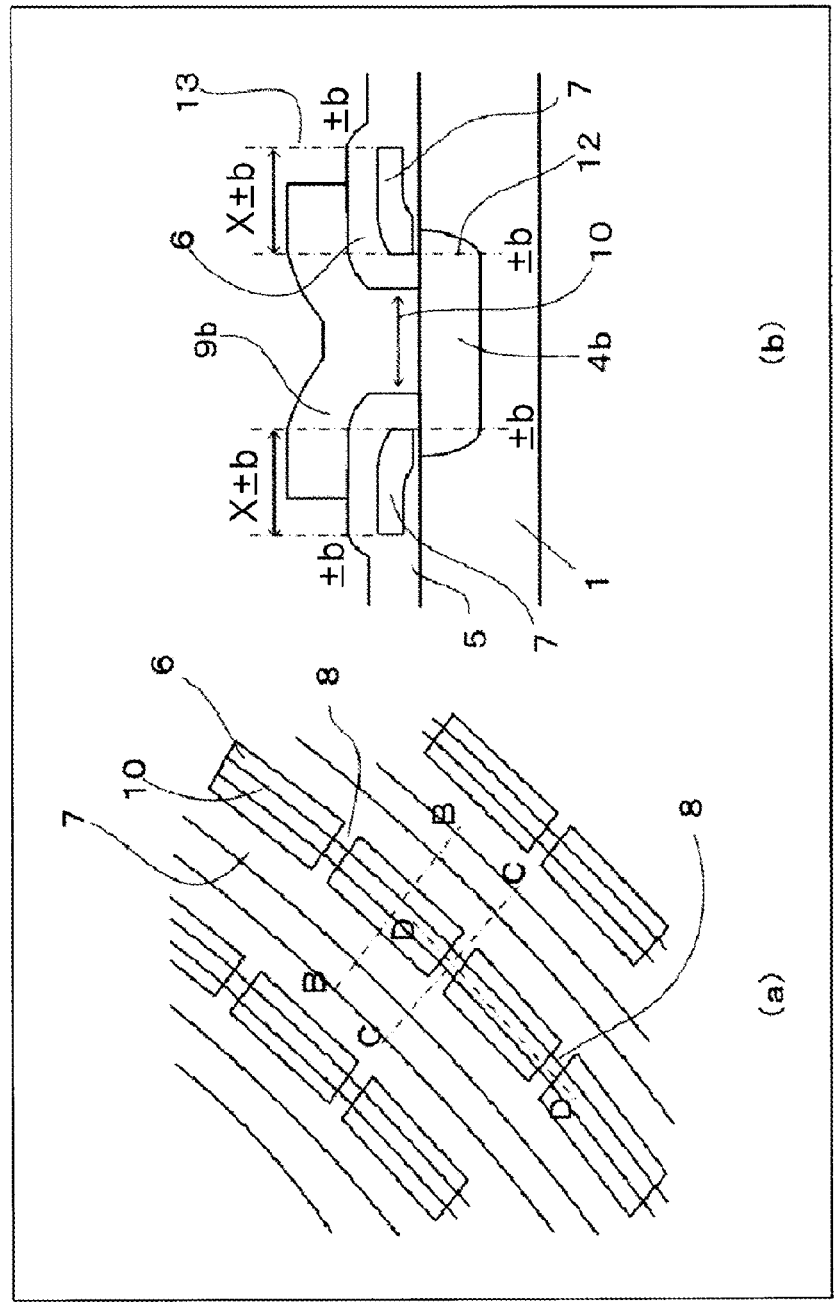
FIG. 2 is a diagram illustrating in detail a main portion of the semiconductor device illustrated in FIG. 1.
Figure 3:
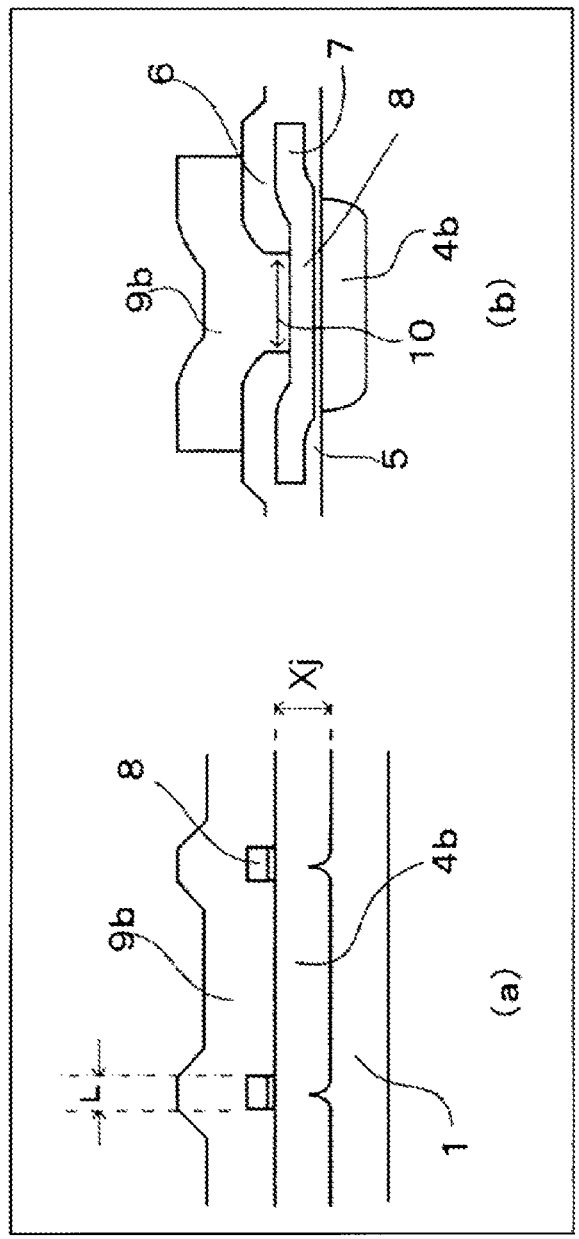
FIG. 3 is a cross-sectional view illustrating in detail the main portion of the semiconductor device illustrated in FIG. 1.
Figure 4:
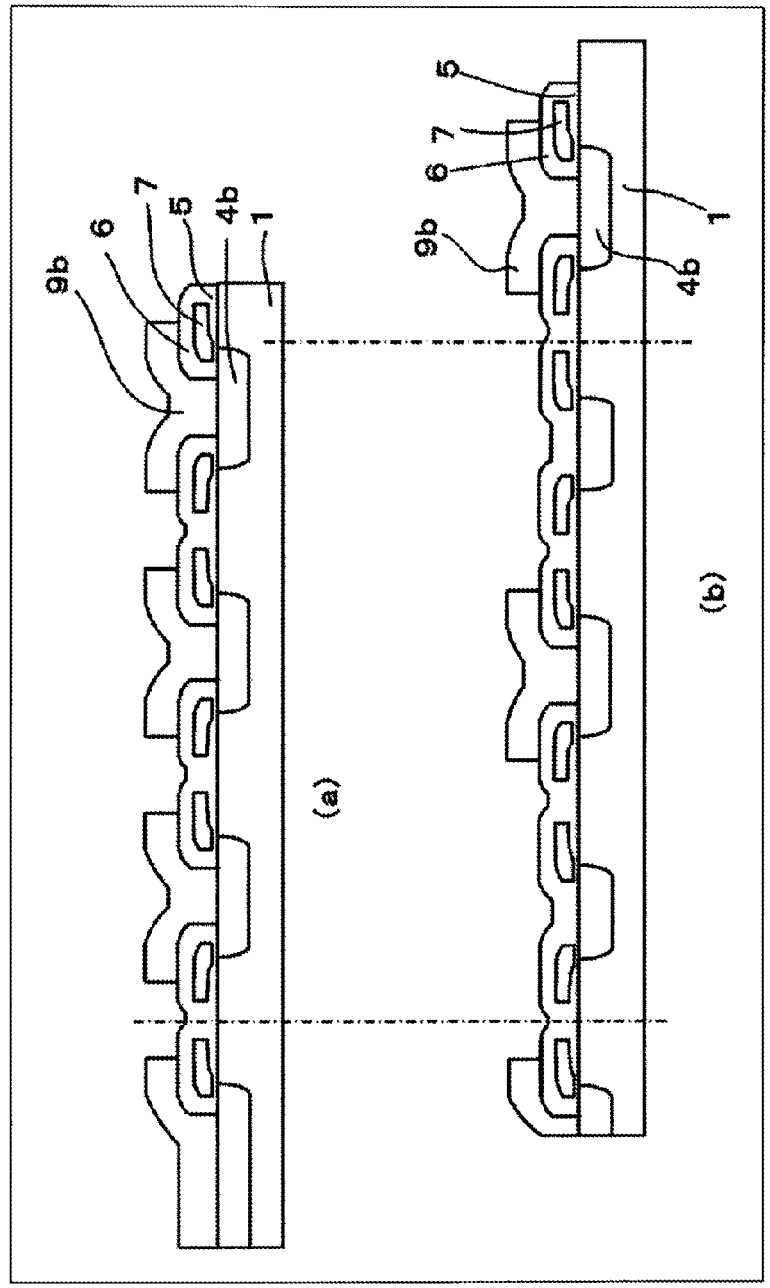
FIG. 4 is a cross-sectional view illustrating in detail the main portion of the semiconductor device illustrated in FIG. 1.

A semiconductor device according to an embodiment of the invention will be described with reference to FIGS. 1 to 4. FIG. 1 is a plan view illustrating the structure of the semiconductor device according to the embodiment of the invention. FIG. 2 is a diagram illustrating in detail a main portion of the semiconductor device illustrated in FIG. 1. FIGS. 3 and 4 are cross-sectional views illustrating in detail the main portion of the semiconductor device illustrated in FIG. 1. As illustrated in the plan view of FIG. 1(b), a semiconductor device according to an embodiment of the invention includes an element active portion 2 which is provided at the center of a semiconductor substrate 1 having a rectangular shape in a plan view and to which a main current flows and a breakdown voltage structure portion 3 which surrounds the outer circumference of the element active portion 2. In FIG. 1(b), the detailed internal structure and planar pattern of the element active portion 2 and the breakdown voltage structure portion 3 are not shown in order to clarify the mutual arrangement of the element active portion 2 and the breakdown voltage structure portion 3.

The breakdown voltage structure portion 3 includes four straight portions 3-1 which are provided along four sides of the n-type semiconductor substrate 1 and corner portions 3-2 which connect the straight portions 3-1 in a curved shape at four corners of the semiconductor substrate 1. In the semiconductor device according to the invention, since the breakdown voltage structure portion 3 is a main structure, the detailed description of the element active portion 2 will not be provided. For example, a known element structure such as a MOS (metal-oxide film-semiconductor) insulated gate semiconductor device or a diode may be formed in the element active portion 2. FIG. 1(a) is an enlarged plan view illustrating the detailed planar pattern in the vicinity of the corner portion 3-2 which is represented by a dashed line circle Z in the breakdown voltage structure portion 3. In FIG. 1(a), a metal field plate 9b is not shown in order to clarify the planar pattern of the breakdown voltage structure portion 3.

As illustrated in FIG. 1(a), in the breakdown voltage structure portion 3, six p-type guard rings 4b are provided in a surface layer of the semiconductor substrate 1 below the pattern illustrated in FIG. 1(a). In FIG. 1(a), the planar pattern represented by a thick line is a contact portion 10 between the surface of the guard ring 4b and the metal field plate 9b which is not illustrated in FIG. 1. Annular polysilicon field plates 7 are provided on each guard ring 4b, with an insulating film (oxide film) 5 interposed therebetween, so as to be separately arranged on the inner circumferential side and the outer circumferential side of the guard ring 4b. In the corner portion 3-2 of the breakdown voltage structure portion 3, a polysilicon bridge 8 which connects the polysilicon field plates 7 in a stair shape is formed on each guard ring 4b.

The metal field plate 9b comes into contact with the polysilicon field plate 7 through the polysilicon bridge 8 in the contact portion 10. The metal field plate 9b comes into contact with the guard ring 4b in the contact portion 10. Therefore, the polysilicon field plate 7 and the guard ring 4b are electrically connected to each other through the metal field plate 9b and have the same potential. In FIG. 1(a), a thick line indicating the contact portion 10 is illustrated as a continuous line. The thick line indicating the contact portion 10 does not cut the polysilicon bridge 8, but indicates an opening portion formed in an interlayer insulating film 6 and the insulating film 5 which are formed between the polysilicon field plate 7 and the metal field plate 9b. The surface of the guard ring 4b and the polysilicon bridge 8 are exposed from the contact portion 10.

The cross-sectional structure of a contact portion between the guard ring 4b and the metal field plate 9b and a contact position between the polysilicon bridge 8 and the metal field plate 9b will be described. FIG. 2(a) is an enlarged plan view illustrating a dashed line frame G illustrated in FIG. 1(a), and FIG. 2(b) is a cross-sectional view taken along the line B-B of FIG. 2(a). FIG. 3(a) is a cross-sectional view taken along the line D-D of FIG. 2(a). FIG. 3(b) is a cross-sectional view taken along the line C-C of FIG. 2(a). In FIG. 2(a), the metal field plate 9b is not illustrated in order to clarify the planar pattern of the polysilicon field plate 7 and the polysilicon bridge 8.

The metal field plate 9b contacts the surface of the guard ring 4b in the contact portion 10 (FIG. 2(b)) and also contacts the surface of the polysilicon bridge 8 (FIGS. 3(a) and 3(b)). In addition, the polysilicon field plates 7 which are separately arranged on the inner circumferential side and the outer circumferential side with the guard ring 4b interposed therebetween are connected to each other by the polysilicon bridge 8 which is made of the same material as that forming the polysilicon field plate 7. Therefore, the guard ring 4b has the same potential as the polysilicon field plate 7 and the metal field plate 9b.

As illustrated in FIG. 2(b), the guard ring 4b is formed by implanting ions into the opening portion of the polysilicon field plate 7 using the polysilicon field plate 7 as a mask, at the same time as, for example, a p base region (not illustrated) of a MOS semiconductor device provided in the element active portion 2 is formed. In FIG. 2(b), the position of the opening portion of the polysilicon field plate 7 is represented by a one-dot chain line 12. Before an ion implantation process for forming the guard ring 4b, the polysilicon field plate 7 and the polysilicon bridge 8 are formed at the same time as a gate oxide film and a polysilicon gate electrode (not illustrated) in the element active portion 2 are formed such that the ends thereof are positioned as represented by the one-dot chain lines 12 and 13.

After the guard ring 4b is formed using the polysilicon field plate 7 as a mask as described above, the metal field plate 9b which is made of, for example, an Al—Si alloy is formed on the polysilicon field plate 7, with the interlayer insulating film 6 interposed therebetween. Then, the metal field plate 9b contacts the guard ring 4b through an opening portion (contact portion 10) which is provided in the interlayer insulating film 6 in advance.

For misalignment which is the problem of the related art when the guard ring 4b, the polysilicon field plate 7, and the metal field plate 9b are formed, when an etching variation which occurs in the patterning of the polysilicon field plate 7 is ±b, a variation in the protruding distance X of the polysilicon field plate 7 between the one-dot chain line 12 and the one-dot chain line 13 is X±b. The variation X±b in the protruding distance X of the polysilicon field plate 7 is less than the variation X±(a+b) in the protruding distance X of the polysilicon field plate 7 according to the related art illustrated in FIG. 6(c) since the number of alignment processes is one less than that in the related art and misalignment is only ±b. In general, the thickness of the polysilicon field plate 7 may be less than that of the insulating film 5 which is a field oxide film. When the thickness of the polysilicon field plate 7 is small, the etching variation is reduced. Therefore, the variation X±b in the protruding distance X of the polysilicon field plate 7 according to the embodiment of the invention is less than the variation X±(a+b) in the protruding distance X according to the related art.

As illustrated in FIG. 2(a), in the cross-section taken along the line D-D, the guard ring 4b according to the invention traverses the polysilicon bridge 8 at two points. FIG. 3(a) illustrates the cross-sectional structure of the polysilicon bridge 8 at the two points. As described above, in the breakdown voltage structure portion 3 according to the invention, the guard ring 4b is formed using the polysilicon field plate 7 as a mask. Therefore, p-type impurity ions for forming the guard ring 4b are not implanted immediately below the polysilicon bridge 8. Thermal diffusion is performed together with the ion implantation such that the guard ring 4b is connected in an annular shape immediately below the polysilicon bridge 8.

When the guard ring 4b is not formed immediately below the polysilicon bridge 8 and is discontinuous, there is a concern that a breakdown voltage will be reduced. Therefore, it is preferable that the width (width in the direction of the line D-D) L of the polysilicon bridge 8 be so small that the guard ring 4b is connected by the thermal diffusion immediately below the polysilicon bridge 8. The thermal diffusion which is performed together with the ion implantation when the guard ring 4b is formed is performed to a diffusion depth Xj in the depth direction from the front surface of the semiconductor substrate 1 and is also performed in a direction parallel to the main surface of the semiconductor substrate 1. Therefore, when the width L of the polysilicon bridge 8 is less than the diffusion width of the p-type impurities which are implemented in order to form the guard ring 4b in the direction parallel to the main surface of the semiconductor substrate 1, the guard ring 4b can be connected by thermal diffusion from both sides of the polysilicon bridge 8.

Figure 7:
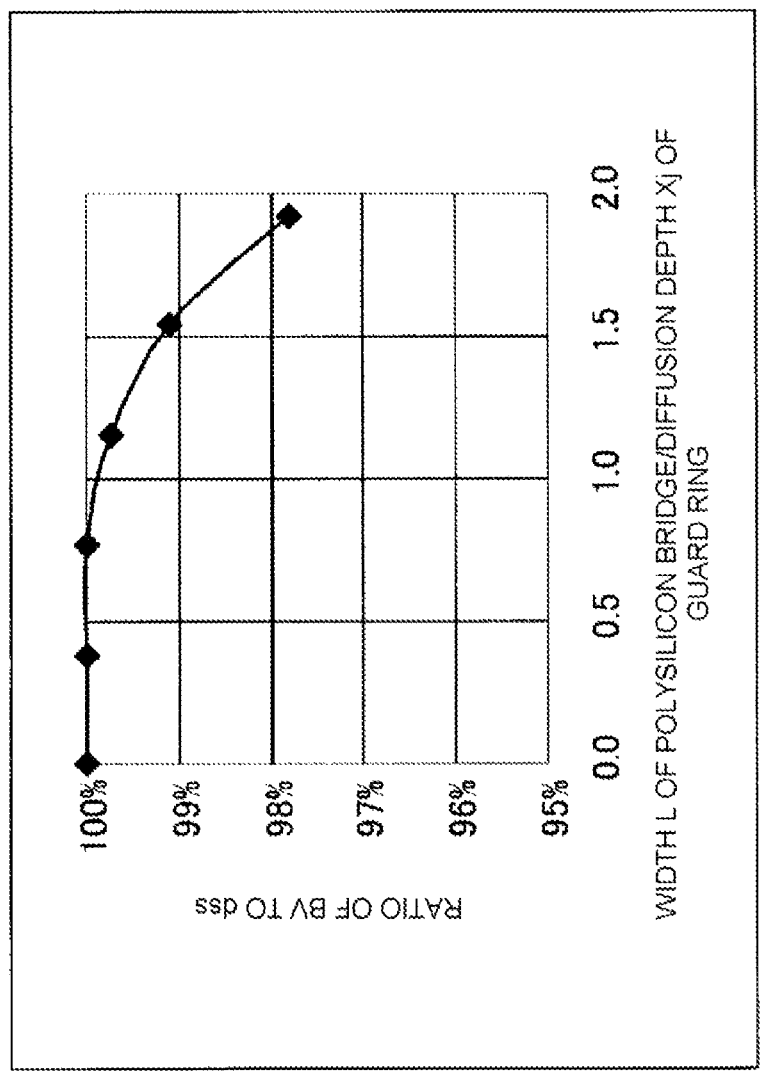
FIG. 7 is a characteristic diagram illustrating a breakdown voltage of the semiconductor device according to the embodiment of the invention.

As illustrated in FIG. 7, the relation between the ratio of the width L of the polysilicon bridge 8 to the diffusion depth Xj of the guard ring 4b (hereinafter, referred to as the width L of the polysilicon bridge 8/the diffusion depth Xj of the guard ring 4b) and the breakdown voltage was verified. FIG. 7 is a characteristic diagram illustrating the breakdown voltage of the semiconductor device according to the embodiment of the invention. In FIG. 7, the horizontal axis is the width L of the polysilicon bridge 8/the diffusion depth Xj of the guard ring 4b. The vertical axis is the percentage of a measured breakdown voltage BVdss with respect to a reference breakdown voltage (100%) which is a breakdown voltage (a breakdown voltage when the guard ring is completely continuous) when the polysilicon bridge 8 is not provided.

The result illustrated in FIG. 7 proved that the breakdown voltage was reduced when the width L of the polysilicon bridge 8/the diffusion depth Xj of the guard ring 4b was greater than 0.8. Therefore, it is preferable that the width of the polysilicon bridge 8 be less than 0.8 times the diffusion depth of the guard ring 4b. For example, when the diffusion depth of the guard ring 4b is 3 µm, it is preferable that the width of the polysilicon bridge 8 be less than 2.4 µm. However, even when the width of the polysilicon bridge 8 is 6 µm that is two times the diffusion depth of the guard ring 4b, a breakdown voltage that is equal to or more than 97% of the reference breakdown voltage is obtained. Therefore, even when the width L of the polysilicon bridge 8/the diffusion depth Xj of the guard ring 4b is greater than 0.8, the breakdown voltage is not immediately reduced.

As illustrated in the cross-sectional view taken along the line C-C of FIG. 3(b), the polysilicon bridge 8 is provided above the guard ring 4b with the insulating film 5 interposed therebetween. The polysilicon bridge 8 connects the polysilicon field plates 7 which are provided above both ends of the guard ring 4b. In addition, the polysilicon bridge 8 is exposed from the contact portion 10. The metal field plate 9b contacts the surface of the polysilicon bridge 8 in the contact portion 10 and is electrically connected to the polysilicon field plate 7. Since the metal field plate 9b contacts the surface of the guard ring 4b and is electrically connected to the guard ring 4b, it is electrically connected to both the guard ring 4b and the polysilicon field plate 7 and the guard ring 4b and the polysilicon field plate 7 have the same potential.

In the breakdown voltage structure portion 3, a plurality of polysilicon bridges 8 are formed in the corner portion 3-2 and the straight portion 3-1 of the breakdown voltage structure portion 3. Since the plurality of polysilicon bridges 8 are formed, the electrical connection between the polysilicon field plates 7 provided on the inner circumferential side and the outer circumferential side is stabilized. Two or more polysilicon bridges 8 may be formed. For example, the number of polysilicon bridges 8 may be set to a value capable of ensuring a sufficient area to bring the metal field plate 9b into close contact with the contact portion 10. For example, when two or more polysilicon bridges 8 are formed, it is preferable that the interval between the polysilicon bridges 8 be equal to or greater than 10 µm.

The above-mentioned effect can be obtained when the metal field plate 9b which electrically connects the polysilicon bridge 8 and the surface of the guard ring 4b is formed between the guard ring 4b in the corner portion 3-2 of the breakdown voltage structure portion and at least one guard ring 4b in the straight portion 3-1 of the breakdown voltage structure portion. In order to further improve the effect, it is preferable that the metal field plate 9b be formed in the entire circumference of at least one guard ring 4b.

The arrangement of the guard rings 4b will be described with reference to FIG. 4. In FIGS. 4(a) and 4(b), the left side of the drawing is the inner circumferential side of the breakdown voltage structure portion 3 and the right side of the drawing is the outer circumferential side of the breakdown voltage structure portion 3. FIG. 4(a) is a cross-sectional view taken along the line E-E of FIG. 1(a) and is a cross-sectional view illustrating the corner portion 3-2 of the breakdown voltage structure portion 3. FIG. 4(b) is a cross-sectional view taken along the line F-F of FIG. 1(a) and is a cross-sectional view illustrating the straight portion 3-1 of the breakdown voltage structure portion 3. The arrangement of the metal field plates 9b in the corner portion 3-2 of the breakdown voltage structure portion 3 illustrated in FIG. 4(a) is compared with the arrangement of the metal field plates 9b in the straight portion 3-1 of the breakdown voltage structure portion 3 illustrated in FIG. 4(b).

As illustrated in FIG. 4(a), in the corner portion 3-2 of the breakdown voltage structure portion 3, the metal field plates 9b are formed on all of the guard rings 4b and contact each of the guard rings 4b. As illustrated in FIG. 4(b), in the straight portion 3-1 of the breakdown voltage structure portion 3, the metal field plates 9b are formed on every other guard ring 4b (alternately) and the width (the width in the direction of the line F-F) of the guard ring 4b which does not contact the metal field plate 9b is less than the width of the guard ring 4b which comes into contact with the metal field plate 9b. As a result, for the overall width of the breakdown voltage structure portion 3, the width of the straight portion 3-1 of the breakdown voltage structure portion 3 can be less than the width of the corner portion 3-2 of the breakdown voltage structure portion 3.

The invention is characterized in that a plurality of polysilicon bridges 8 are provided on both the guard rings 4b in the corner portion 3-2 of the breakdown voltage structure portion 3 and the guard rings 4b in the straight portion 3-1 of the breakdown voltage structure portion 3. Therefore, the guard ring 4b and the polysilicon field plate 7 in the straight portion 3-1 of the breakdown voltage structure portion 3 are connected to each other through the metal field plate 9b so as to have the same potential. According to the characteristics, on the guard ring 4b, there is little potential difference between the contact portion 10 in the corner portion 3-2 of the breakdown voltage structure portion 3 and the guard ring 4b in the straight portion 3-1 of the breakdown voltage structure portion 3 or the vicinity of the middle of the polysilicon field plate 7 which is provided on the guard ring 4b.

Even when there is external charge on the surface of the breakdown voltage structure portion 3, the occurrence of the potential difference is prevented and it is possible to maintain the balance of an electric field intensity distribution. Therefore, it is possible to prevent the occurrence of local avalanche breakdown. As a result, a reduction in the breakdown voltage is prevented and it is possible to obtain high long-term reliability. In particular, the effect is remarkable when a chip size increases in order to increase the amount of current flowing through the element and the length of the straight portion 3-1 of the breakdown voltage structure portion 3 increases in order to respond to the increase in the chip size, or when the area of the breakdown voltage structure portion 3 increases in order to improve resistance to the rated voltage (for example, 600 V to 1700 V, 3300 V, 4500 V, or 6500 V).

Figure 5:
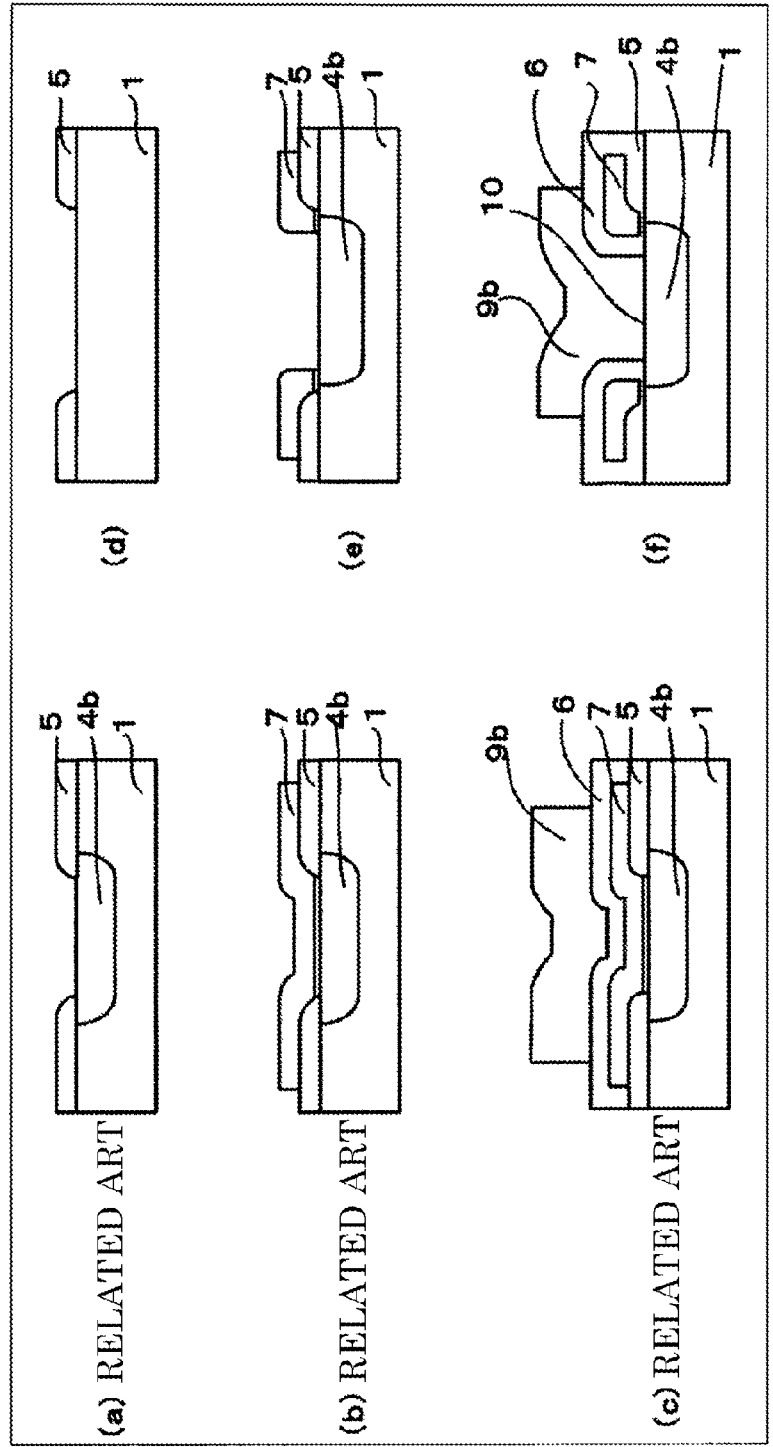
FIG. 5 is a cross-sectional view illustrating the state of main portions of the semiconductor device according to the embodiment of the invention and the semiconductor device according to the related art during manufacture.

Next, a method of manufacturing the semiconductor device according to the embodiment of the invention will be described while being compared with the manufacturing method according to the related art. FIG. 5 is a cross-sectional view illustrating the state of main portions of the semiconductor device according to the embodiment of the invention and the semiconductor device according to the related art during manufacture. FIGS. 5(a) to 5(c) are cross-sectional views illustrating the main portion in the vicinity of the guard ring in the method of manufacturing the semiconductor device according to the related art. FIGS. 5(d) to 5(f) are cross-sectional views illustrating the main portion in the vicinity of the guard ring 4b in the semiconductor device according to the embodiment of the invention, in order to clarify the difference from the manufacturing method according to the related art. Therefore, the description is focused on the breakdown voltage structure portion 3 in the method of manufacturing the semiconductor device. In addition, an example in which a MOS semiconductor device is formed in the element active portion 2 will be described.

First, the insulating film 5, which is an oxide film, is formed on the front surface of the n-type semiconductor substrate 1 by thermal oxidation. In the method of manufacturing the semiconductor device according to the related art, the thick insulating film 5 is patterned and etched so as to remain in the breakdown voltage structure portion 3, an opening portion is formed in the insulating film 5 on a region which will be the p-type guard ring 4b by the known photolithography process, and the guard ring 4b is formed in the opening portion of the insulating film 5 by ion implantation (FIG. 5(a)). In contrast, in the method of manufacturing the semiconductor device according to the embodiment of the invention, only the insulating film 5 and the opening portion thereof are formed. In this stage, the guard ring 4b has not been formed (FIG. 5(d)).

Then, in the method of manufacturing the semiconductor device according to the related art, a gate oxide film of the element active portion 2 is formed and a gate polysilicon layer is grown. Then, patterning and dry etching are performed on the gate polysilicon layer to form the gate electrode (not illustrated) of the element active portion 2 and the polysilicon field plate 7 of the breakdown voltage structure portion 3 at the same time as illustrated in FIG. 5(b). In contrast, in the method of manufacturing the semiconductor device according to the embodiment of the invention, as illustrated in FIG. 5(e), an opening portion for forming the guard ring 4b is formed in a polysilicon layer which is deposited for the polysilicon field plate 7 and p-type impurity ions, such as boron ions, are implanted into the semiconductor substrate 1 using the polysilicon layer as a mask to form the guard ring 4b. The polysilicon bridge 8 may be formed of the same material as that forming the polysilicon field plate 7 at the same time as the polysilicon field plate 7 is formed, which is not illustrated in the drawings.

Figure 6:
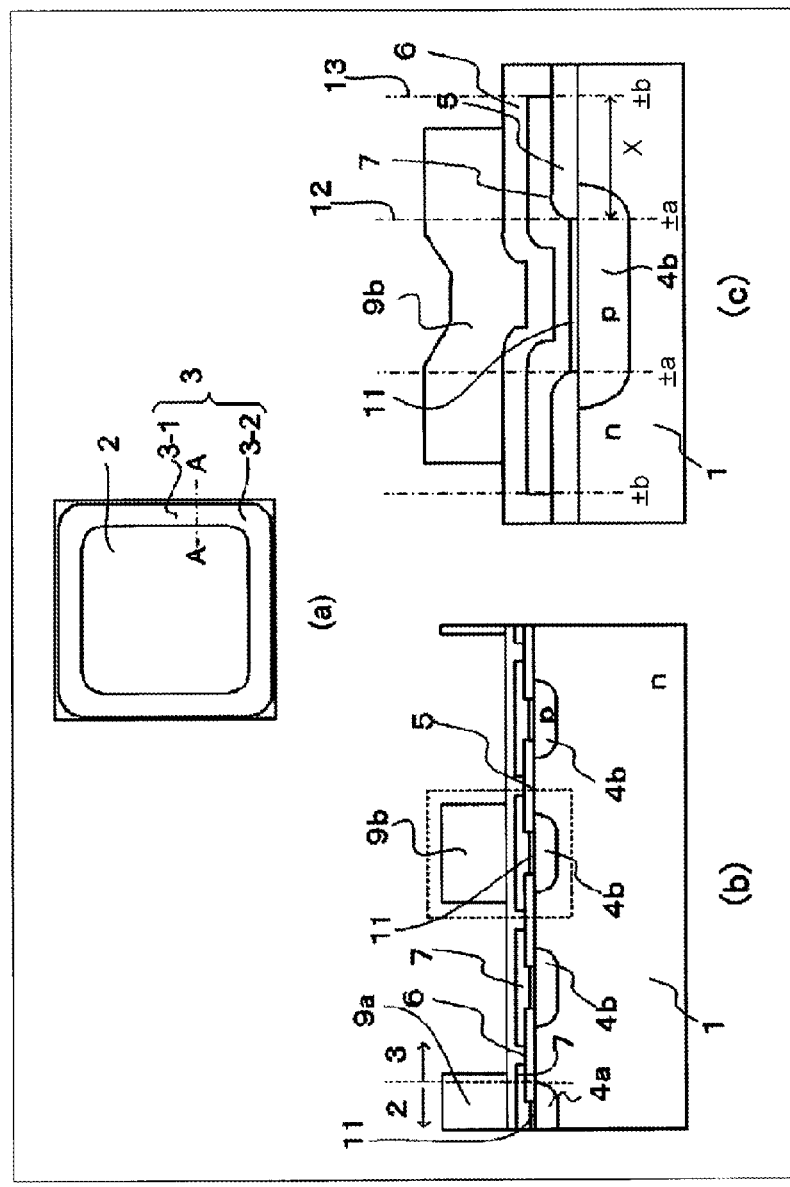
FIG. 6 is a diagram illustrating the structure of the semiconductor device according to the related art.

Then, in the method of manufacturing the semiconductor device according to the related art, as illustrated in FIG. 5(c), the interlayer insulating film 6 is formed by a CVD (Chemical Vapor Deposition) method. Then, a metal film made of, for example, an Al—Si alloy is deposited on the interlayer insulating film 6 by, for example, a sputtering method to form the metal field plate 9b. Then, for example, the rear surface structure (not illustrated) of the element active portion 2 is formed. In this way, the semiconductor device according to the related art is completed as illustrated in FIG. 6(c). In contrast, in the method of manufacturing the semiconductor device according to the embodiment of the invention, as illustrated in FIG. 5(f), after the interlayer insulating film 6 is formed by the CVD method, the contact portion 10 for bring the metal field plate 9b into contact with the surface of the guard ring 4b is formed in the interlayer insulating film 6. Then, a metal film made of, for example, an Al—Si alloy is formed in the contact portion 10 by, for example, the sputtering method. Then, the metal film is patterned so as to remain in the contact portion 10 and the metal field plate 9b is formed. Then, for example, the rear surface structure (not illustrated) of the element active portion 2 is formed. In this way, the semiconductor device illustrated in FIG. 2(b) or FIG. 4(a) is completed.

As described above, the field plate has the double structure of the metal field plate and the polysilicon field plate. Therefore, it is possible to reduce the thickness of the metal field plate, as compared to the structure in which the field plate includes only the metal field plate. In this way, it is possible to improve the processing accuracy of the metal field plate. Therefore, it is possible to reduce a variation in the amount of etching such as a variation in side etching width. As a result, it is possible to reduce a variation in the initial breakdown voltage.

According to the embodiment, since ion implantation for forming the self-aligned guard ring is performed using the polysilicon field plate as a mask, an alignment process for forming the guard ring may not be performed. Therefore, a variation in the protruding distance of the polysilicon field plate can be only a variation in etching when the polysilicon field plate is patterned. In this way, it is possible to reduce misalignment and prevent the relative positional deviation between the guard ring and the field plate. Therefore, it is possible to reduce a variation in the initial breakdown voltage.

According to the embodiment, the potential of the polysilicon field plate and the guard ring is sufficiently fixed through the metal field plate and the polysilicon bridge and the polysilicon field plate and the guard ring have the same potential. In this way, on the same guard ring, the potential between the contact portion in the corner portion of the breakdown voltage structure portion and the guard ring in the straight portion of the breakdown voltage structure portion or the vicinity of the middle of the polysilicon field plate which is provided on the guard ring is fixed and there is little potential difference therebetween. Therefore, it is possible to obtain the capability of stably reducing the electric field and reduce a variation in the initial breakdown voltage.

According to the embodiment, the potential of the polysilicon field plate and the guard ring is sufficiently fixed and the polysilicon field plate and the guard ring have the same potential. Therefore, even when external charge is supplied onto the breakdown voltage structure portion, it is possible to prevent the occurrence of the potential difference between the contact portion in the corner portion of the breakdown voltage structure portion and the guard ring in the straight portion of the breakdown voltage structure portion or the vicinity of the middle of the polysilicon field plate which is provided on the guard ring, on the same guard ring. In this way, it is possible to prevent the occurrence of local avalanche breakdown and thus prevent a reduction in the breakdown voltage. Therefore, it is possible to provide a semiconductor device with long-term reliability.

The invention is not limited to the above-described embodiment, but can be applied to various semiconductor devices including the breakdown voltage structure portion which surrounds the element active portion. Specifically, in the above-described embodiment, the breakdown voltage structure portion has been mainly described and the detailed description of the element active portion is not provided. However, for example, a MOSFET (Metal Oxide Semiconductor Field Effect Transistor: insulated gate electric field effect transistor), an IGBT (Insulated Gate Bipolar Transistor), or a diode may be used as the element formed in the element active portion. In this case, the breakdown voltage structure portion of the semiconductor device according to the above-described embodiment of the invention may be applied to a breakdown voltage structure portion which surrounds a well-known element active portion of the element.

INDUSTRIAL APPLICABILITY

As described above, the semiconductor device and the method of manufacturing the semiconductor device according to the invention are useful for a high-breakdown-voltage power semiconductor device which is used in, for example, a power conversion apparatus.

REFERENCE SIGNS LIST

1 SEMICONDUCTOR SUBSTRATE
2 ELEMENT ACTIVE PORTION
3 BREAKDOWN VOLTAGE STRUCTURE PORTION
3-1 STRAIGHT PORTION OF BREAKDOWN VOLTAGE STRUCTURE PORTION
3-2 CORNER PORTION OF BREAKDOWN VOLTAGE STRUCTURE PORTION
4b GUARD RING
5 INSULATING FILM
6 INTERLAYER INSULATING FILM
7 POLYSILICON FIELD PLATE
8 POLYSILICON BRIDGE
9a METAL ELECTRODE
9b METAL FIELD PLATE
10 CONTACT PORTION
11 OXIDE FILM
12, 13 ONE-DOT CHAIN LINE

The invention claimed is:

1. A semiconductor device comprising:
an element active portion which is provided in a rectangular first-conduction-type semiconductor substrate and to which a main current flows;
an edge termination structure portion that includes straight portions and corner portions connecting the straight portions in a curved shape and surrounds the element active portion;
second-conduction-type guard rings that are provided in a surface layer of the first-conduction-type semiconductor substrate so as to extend from the straight portions to the corner portions of the edge termination structure portion;
annular polysilicon field plates that are provided above a surface of the guard rings with an insulating film interposed therebetween and are separately arranged on an inner circumferential side and an outer circumferential side of the guard rings;
a plurality of polysilicon bridges that are provided on the insulating film between the polysilicon field plates on the inner circumferential side and the polysilicon field plates on the outer circumferential side and connect the polysilicon field plates at a predetermined interval;
an interlayer insulating film that is provided on surfaces of the insulating film, the polysilicon field plates, the polysilicon bridges, and the guard rings;
contact holes that are provided in the interlayer insulating film such that the polysilicon bridges and the guard rings are selectively exposed; and
metal field plates that comes into contact with the selectively exposed polysilicon bridges and the selectively exposed guard rings through the contact holes and electrically connects the selectively exposed polysilicon bridges and a surface of the selectively exposed guard rings,
wherein the metal field plates are provided on the guard rings in the corner portions of the edge termination structure portion and at least one of the guard rings in the straight portions of the edge termination structure portion.

2. The semiconductor device according to claim 1,
wherein the guard rings are arranged in an annular shape, and
a metal field plate is provided in an entire circumference of at least one of the guard rings.

3. The semiconductor device according to claim 1,
wherein a width of the polysilicon bridges is less than two times a diffusion depth of the guard rings.

4. The semiconductor device according to claim 3,
wherein the width of the polysilicon bridges is less than 0.8 times the diffusion depth of the guard rings.

5. The semiconductor device according to claim 1,
wherein guard rings having the metal field plates provided in both corner portions and straight portions of the edge termination structure portion, and guard rings having the metal field plates provided only in corner portions of the edge termination structure portion, are alternately arranged in a direction from the element active portion to an outer circumferential portion of the first-conduction-type semiconductor substrate.

6. A method of manufacturing a semiconductor device including an element active portion which is provided in a rectangular first-conduction-type semiconductor substrate and to which a main current flows, a breakdown voltage structure portion that includes straight portions and corner portions connecting the straight portions in a curved shape and surrounds the element active portion, second-conduction-type guard rings that are provided in a surface layer of the first-conduction-type semiconductor substrate so as to extend from the straight portions to the corner portions of the breakdown voltage structure portion, annular polysilicon field plates that are provided above a surface of the guard rings with an insulating film interposed therebetween and are separately arranged on an inner circumferential side and an outer circumferential side of the guard rings, a plurality of polysilicon bridges that are provided on the insulating film between the polysilicon field plates on the inner circumferential side and the polysilicon field plates on the outer circumferential side and connect the polysilicon field plates at a predetermined interval, an interlayer insulating film that is provided on surfaces of the insulating film, the polysilicon field plates, the polysilicon bridges, and the guard rings, contact holes that are provided in the interlayer insulating film such that the polysilicon bridges and the guard rings are selectively exposed, and metal field plates that come into contact with the selectively exposed polysilicon bridges and the selectively exposed guard rings through the contact holes and electrically connects the selectively exposed polysilicon bridges and a surface of the selectively exposed guard rings, the metal field plates being provided on the guard rings in the corner portions of the breakdown voltage structure portion and at least one of the guard rings in the straight portions of the breakdown voltage structure portion, the method comprising:
- forming a plurality of the annular polysilicon field plates that surround the element active portion on a surface of the first-conduction-type semiconductor substrate; and
- implanting second-conduction-type impurities into a portion of the first-conduction-type semiconductor substrate which is exposed between the polysilicon field plates using the polysilicon field plates as a mask to form the guard rings.

7. The semiconductor device according to claim 2, wherein guard rings having the metal field plates provided in both corner portions and straight portions of the edge termination structure portion, and guard rings having the metal field plates provided only in corner portions of the edge termination structure portion, are alternately arranged in a direction from the element active portion to an outer circumferential portion of the first-conduction-type semiconductor substrate.

8. The semiconductor device according to claim 3, wherein guard rings having the metal field plates provided in both corner portions and straight portions of the edge termination structure portion, and guard rings having the metal field plates provided only in corner portions of the edge termination structure portion, are alternately arranged in a direction from the element active portion to an outer circumferential portion of the first-conduction-type semiconductor substrate.

9. The semiconductor device according to claim 4, wherein guard rings having the metal field plates provided in both corner portions and straight portions of the edge termination structure portion, and guard rings having the metal field plates provided only in corner portions of the edge termination structure portion, are alternately arranged in a direction from the element active portion to an outer circumferential portion of the first-conduction-type semiconductor substrate.

10. A device, comprising:
- an active element portion on a semiconductor substrate; and
- an edge structure bordering the active element portion, and including straight portions and curved corner portions;
wherein the edge structure further includes
- guard rings in the straight portions and curved corner portions,
- bridge structures at intervals along a periphery of the edge structure, and
- connective structures for electrically connecting the guard rings to the bridge structures,
the guard rings including
- a first guard ring in a first curved corner portion and a first straight portion of the straight portions and curved corner portions, and
- a second guard ring, adjacent to the first guard ring, in a second curved corner portion and a second straight portion of the straight portions and curved corner portions; and
wherein a connective structure of the connective structures is present in both the first curved corner portion and in second curved corner portion, and
in the second guard ring, a connective structure of the connective structures is present in the second curved corner portion but absent in at least part of the second straight portion.

11. The device of claim 10, wherein the semiconductor substrate is of a first conduction type, and the guard rings are of a second conduction type and formed in a surface layer of the semiconductor substrate.

12. The device of claim 11, wherein the connective structures comprise metal field plates in a contact groove formed in an insulating film on the semiconductor substrate.

13. The device of claim 12, wherein the bridge structures have a width smaller than a diffusion depth of the guard rings.

14. The device of claim 13, wherein the width of the bridge structures is less than 0.8 times the diffusion depth of the guard rings.

15. The semiconductor device of claim 1, wherein the plurality of polysilicon bridges are located at the guard rings across the insulating film.

16. The semiconductor device of claim 1, wherein the guard rings adjoin with each other and are connected in an annular shape immediately below the plurality of polysilicon bridges.

\* \* \* \* \*